United States Patent
Ma

(10) Patent No.: US 7,482,266 B2
(45) Date of Patent: Jan. 27, 2009

(54) METHOD OF FORMING COMPOSITE OPENING AND METHOD OF DUAL DAMASCENE PROCESS USING THE SAME

(75) Inventor: Hong Ma, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/675,417

(22) Filed: Feb. 15, 2007

(65) Prior Publication Data

US 2008/0200025 A1    Aug. 21, 2008

(51) Int. Cl.
*H01L 21/44* (2006.01)
(52) U.S. Cl. .................. 438/638; 438/640; 438/668
(58) Field of Classification Search .............. 438/618, 438/622, 627, 637, 638, 640, 653, 666, 668, 438/675, 687
See application file for complete search history.

(56) References Cited

U.S. PATENT DOCUMENTS

| | | | | |
|---|---|---|---|---|
| 6,150,252 A | * | 11/2000 | Hsu et al. | 438/597 |
| 6,472,231 B1 | * | 10/2002 | Gabriel et al. | 438/9 |
| 2004/0077175 A1 | * | 4/2004 | Hsieh et al. | 438/694 |
| 2004/0147108 A1 | * | 7/2004 | Lamb et al. | 438/622 |
| 2005/0085066 A1 | * | 4/2005 | Tsao et al. | 438/633 |

* cited by examiner

*Primary Examiner*—Kevin M Picardat
(74) *Attorney, Agent, or Firm*—J.C. Patents

(57) ABSTRACT

A dual damascene process is provided. A dielectric layer is formed on a substrate and then a via opening is formed in the dielectric layer to expose a liner formed on the substrate. A gap fill (GF) layer is filled into the via opening and a resistant layer is formed on the substrate. A photolithographic process and an etching process are performed to form a trench in the dielectric layer and to remain the gap fill material having a top surface with a convex shape. In the etching process, an etching rate of the gap fill material layer is larger than that of the resistant layer. The gap fill material, the resistant layer, and the liner exposed by the via opening are removed. A conductive layer fills out the trench and the via opening. This invention is focusing on controlling etch-rate to avoid shielding effect when forming the composite opening.

21 Claims, 6 Drawing Sheets

METHOD OF FORMING COMPOSITE OPENING AND METHOD OF DUAL DAMASCENE PROCESS USING THE SAME

BACKGROUND OF THE INVENTION

1. Field of Invention

The present invention relates to a semiconductor process. More particularly, the present invention relates to a method of forming a composite opening and a dual damascene process using the same.

2. Description of Related Art

With the progress of integration of semiconductor devices, the use of multi-metal interconnects are becoming wide spread. Usually, the lower the resistance of the metal layer of the multi-metal interconnects is, the higher the reliability of elements is, and the better the performance of the element can be. Among metal materials, the copper is suitable to be used for the multi-metal interconnects because the resistance of copper is low. However, as it is difficult to pattern the copper in the conventional photolithographic etching technique, a dual damascene process has been developed.

The dual damascene process is a technique that involves forming a trench and a via opening in a dielectric layer and then refilling a metal to form a metal wire and a via. The dual damascene process includes many methods which involve forming a via opening in the dielectric layer first and then forming a trench; and forming the trench first and then forming the via.

When the method of forming the via opening first and then forming the trench is employed in the dual damascene process, in the etching process of forming the trench, the corresponding metal layer under the via opening may be damaged by etching, thus causing the electrical problem of elements.

Referring to FIG. 1, in order to prevent the corresponding metal layer 102 under the via opening from being damaged by etchant in the etching process of forming the trench, a recent method includes after a via opening 110 is formed in a dielectric layer 106, first filling a gap fill material 112 in the via opening 110 to prevent the corresponding metal layer 102 under the via opening 110 from being damaged by etchant. However, in the method, usually because of the shadowing effect of the gap fill material 112, after the trench 120 is formed in the subsequent etching, a dielectric layer 106a with a fence shape is left at a corner 110a of the via opening 110, thus causing the problem of the reliability of elements. However, it is quite difficult to eliminate the fence-shaped dielectric layer. It is applicable to adjust the height of the gap fill material to prevent the forming of the fence-shaped dielectric layer. However, under the influence of uniformity of etching and micro-loading effect, the thicknesses of the gap fill material at the center of the substrate and at the edge of the substrate, or the thicknesses of the gap fill material in a dense region and in a loose region of the substrate are greatly different, such that the process window is very narrow.

In another aspect, referring to FIG. 2, in order to prevent the forming of the fence-shaped dielectric layer in the etching process, a polymer light process is adopted in a trench etching process. But, without the protection of the polymer, the dielectric layer 106 at the corner 120a of the trench 120 is easily damaged by the etchant, and thus the corner 120a of the trench 120 is rounded. After the metal layer 122 is deposited subsequently to fill in the trench with the rounded corner, the two neighboring dual damascene structures may be bridged subsequently.

SUMMARY OF THE INVENTION

Accordingly, the present invention is directed to provide a method of fabricating a dual damascene structure, in which the corner of a trench can be prevented from being rounded and also the bridging of two neighboring dual damascene structures can be overcome.

The present invention is also directed to provide a method of fabricating the dual damascene structure, in which the forming of a fence-shaped dielectric layer can be prevented.

The present invention is further directed to provide a method of forming a composite opening, in which the corner of a wide opening can be prevented from being rounded and the forming of a fence at the corner of the narrow opening can be prevented.

The present invention provides a dual damascene process. In the method, a dielectric layer is formed on the substrate in which a liner is formed, and a via opening is formed in the dielectric layer to expose the liner on the substrate. Then, a gap fill material is filled in the via opening, and a resistant layer is formed on the substrate. Next, a photolithographic process and an etching process are performed to form a trench in the dielectric layer to remain the gap fill material having a top surface with a convex shape. In the etching process, the etching rate of the gap fill material layer is larger than that of the resistant layer. Then, the gap fill material, the resistant layer, and the liner exposed by the via opening are removed, and a conductive layer is formed in the trench and the via opening.

In the dual damascene process according to an embodiment of the present invention, in the etching process, the etching selectivity of the gap fill material to the resistant layer ranges from 3 to 1.1.

In the dual damascene process according to an embodiment of the present invention, in the etching process, the etching rate of the gap fill material is larger than that of the dielectric layer.

In the dual damascene process according to an embodiment of the present invention, in the etching process, the etching selectivity of the gap fill material to the dielectric layer ranges from 1.2 to 2.

In the dual damascene process according to an embodiment of the present invention, the etching rate of the resistant layer is larger than that of the dielectric layer.

In the dual damascene process according to an embodiment of the present invention, in the etching process, an etching gas is free of oxygen.

In the dual damascene process according to an embodiment of the present invention, an etching gas used in the etching process includes fluorohydrocarbon.

In the dual damascene process according to an embodiment of the present invention, the etching gas further includes a carrier gas.

In the dual damascene process according to an embodiment of the present invention, the etching gas further includes an adjusted gas.

In the dual damascene process according to an embodiment of the present invention, the material of the dielectric layer comprises a low dielectric constant material.

According to the embodiment of the present invention, the dual damascene process further comprises forming a cap layer on the dielectric layer before the via opening is formed.

In the dual damascene process according to an embodiment of the present invention, the gap fill material comprises a polymer without anti-reflective property.

The present invention provides a method of forming a composite opening. A material layer is formed on a substrate, and then a narrow opening is formed in the material layer. Next, a gap fill material is formed in the narrow opening. After that, a resistant layer is formed on the substrate to cover the material layer and the gap fill material. Then, a photolithographic process and an etching process are performed to form a wide opening in communication with the narrow opening in the material layer, and to remain the gap fill material having a top surface with a convex shape, wherein in the etching process, the etching rate of the gap fill material larger than that of the resistant layer. Afterwards, the gap fill material and the resistant layer are removed to expose the wide opening and the narrow opening, so as to form the composite opening.

In the method of forming the composite opening according to an embodiment of the present invention, in the etching process, the etching selectivity of the gap fill material to the resistant layer ranges from 3 to 1.1.

In the method of forming the composite opening according to an embodiment of the present invention, in the etching process, the etching rate of the gap fill material is larger than that of the material layer.

In the method of forming the composite opening according to an embodiment of the present invention, in the etching process, the etching selectivity of the gap fill material to the material layer ranges from 1.2 to 2.

In the method of forming the composite opening according to an embodiment of the present invention, the etching rate of the resistant layer is larger than that of the material layer.

According to the embodiment of the present invention, in the method of forming the composite opening, the material of the gap fill material comprises a polymer without anti-reflective property.

According to the embodiment of the present invention, in the method of forming the composite opening, an etching gas used in the etching process includes fluorohydrocarbon.

According to the embodiment of the present invention, in the method of forming the composite opening, the etching gas further includes a carrier gas.

According to the embodiment of the present invention, in the method of forming the composite opening, the etching gas further includes an adjusted gas.

The method of fabricating the dual damascene structure of the present invention can prevent the corner of the trench from being rounded, prevent the two neighboring dual damascene structures from being bridged, and prevent the forming of the fence-shaped dielectric layer at the corner of the via opening.

The method of forming the composite opening of the present invention can prevent the corner of the wide opening from being rounded and prevent the corner of the narrow opening from forming the fence-shaped bump.

In order to the make aforementioned and other objects, features and advantages of the present invention comprehensible, preferred embodiments accompanied with figures are described in detail below.

DESCRIPTION OF EMBODIMENTS

The First Embodiment

Figure 1:
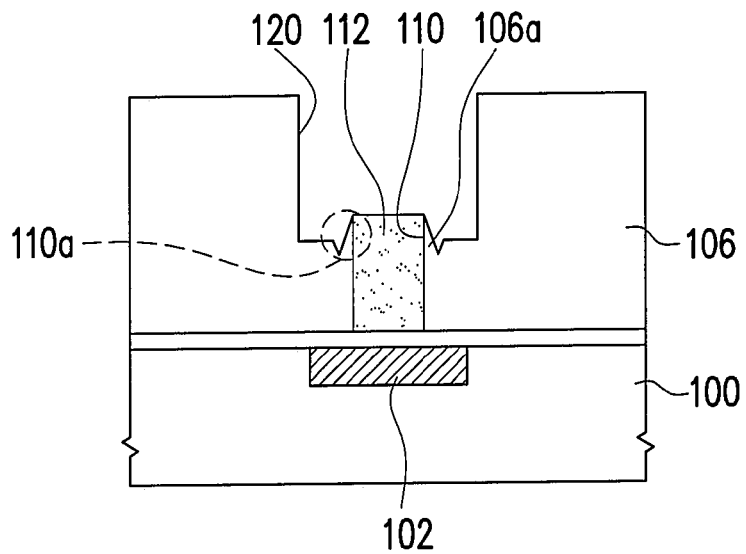
FIG. 1 is a schematic cross-sectional view of a fence-shaped dielectric layer formed in a conventional dual damascene process.
Figure 2:
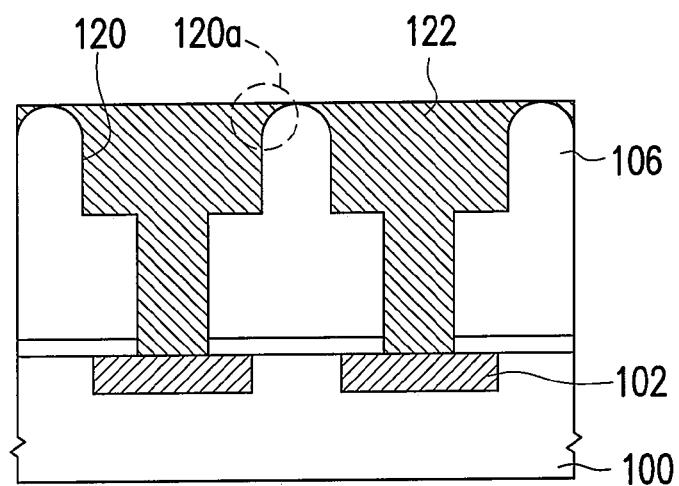
FIG. 2 is a schematic cross-sectional view of the bridging caused by the rounding of corner of a trench in a conventional dual damascene process.
Figure 3A:
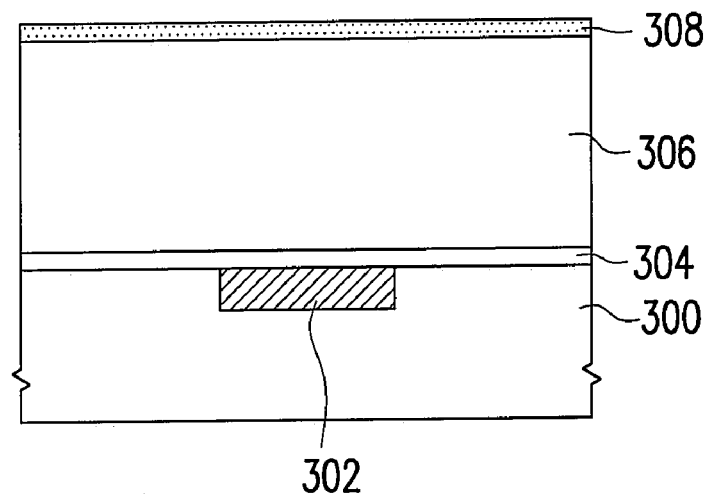
FIGS. 3A to 3F are schematic cross-sectional views of a dual damascene process according to an embodiment of the present invention.

Referring to FIG. 3A, the dual damascene structure of this embodiment is formed on a substrate 300. A conductive layer 302 is already formed on the substrate 300, and a liner 304 is already covered on the conductive layer 302. The substrate 300 is, for example, a semiconductor substrate, such as a silicon substrate or a silicon-on-insulator (SOI) substrate. The conductive layer 302 is, for example, a metal interconnect, such as a copper wire. The liner 304 covered on the conductive layer 302 can be used to prevent the conductive layer 302 from being oxidized, the material thereof is, for example, a layer of SiN, and the forming method is, for example, chemical vapor deposition (CVD). A dielectric layer 306 is formed on the liner 304, and the material thereof is, for example, a low dielectric constant material. The low dielectric constant material is a material layer with a dielectric constant lower than 4, for example fluorinated silicon glass (FSG); silsesquioxnane, such as hydrogen silsesquioxnane (HSQ), methyl silsesquioxane (MSQ), and hybrido-organo siloxane polymer (HOSP); aromatic hydrocarbon, such as SiLK; organosilicate glass, such as black diamond (BD), 3MS, 4MS; parylene; Fluoro-Polymer, such as PFCB, CYTOP, Teflon; poly (arylethers), such as PAE-2, FLARE; porous polymer, such as XLIK, Nanofoam, Awrogel; Coral; and the like. In an embodiment, a cap layer 308 is further formed on the dielectric layer 306, the material thereof is selected from a group consisting of silicon oxide (SiO), silicon nitride (SiN), silicon-oxy-nitride (SiON), silicon carbide (SiC), silicon oxycarbide (SiCO), silicon carbide nitride (SiCN), silicon carboxynitride (SiCNO) and the combination thereof and the forming method is, for example, CVD.

Figure 3B:
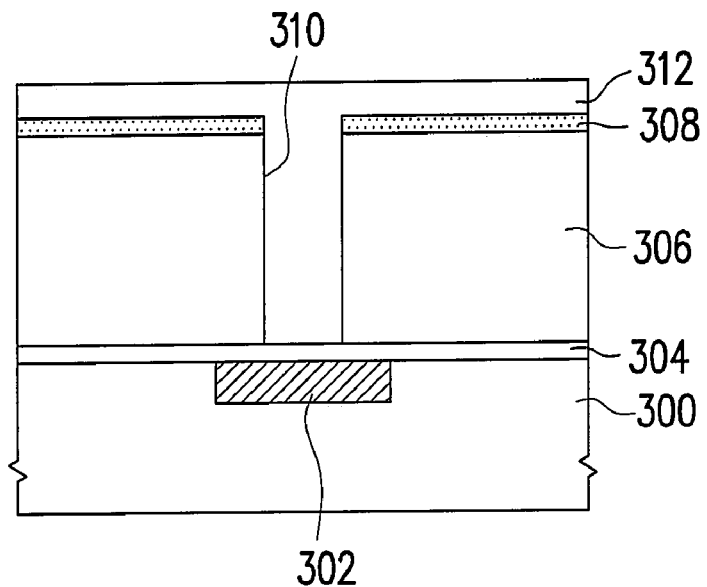

Then, referring to FIG. 3B, a photolithographic process and an etching process are performed, so as to form a via opening 310 in the dielectric layer 306. The etching gas used in the etching process is, for example, $CF_4/Ar/N_2$ or $CHF_3/Ar/N_2$. Then, a gap fill material 312 is filled in the via opening 310. The uniformity of the deposition of the gap fill material 312 is good, so the difference between the gap fill material 312 in the dense region and in the loose region is small. The material of the gap fill material 312 includes a polymer without anti-reflective property, for example, GF43 and DUV52, and the forming method is, for example, spin coating.

Figure 3C:
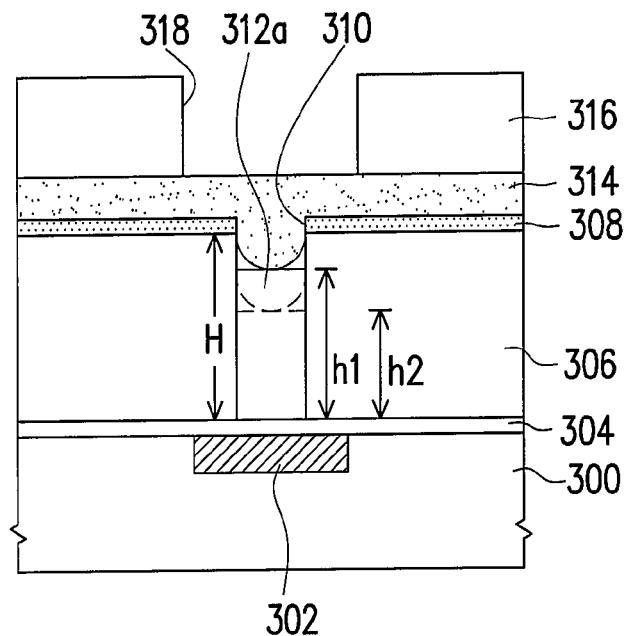

Afterwards, referring to FIG. 3C, a part of the gap fill material 312 is removed, and the gap fill material 312a in the via opening 310 is left. The remaining gap fill material 312a has a substantial flat surface or a depressed surface with lower central portion and higher sides. The process of removing a part of the gap fill material 312 can be an etch back process. Then, a resistant layer 314 such as a bottom anti-reflective coating is formed on the substrate 300. The height of the remaining gap fill material 312a is not limited, and can be $h_1$ or $h_2$ (indicated by the dotted line). The uniformity of the etch back of the gap fill material 312 is good, and the difference between the remaining gap fill material 312a in the dense region and in the loose region is not obvious. Therefore, the resistant layer 314 formed subsequently has a fine uniformity and the surface is quite flat. Also, in the subsequent photolithographic process, the quality of the patterning is not affected by the uneven height of the surface of the substrate. After that, a patterned photoresist layer 316 is formed on the resistant layer 314. The photoresist layer 316 has an opening pattern 318, and the opening pattern 318 is a pattern that is predetermined to form the trench in the dielectric layer 306.

Figure 3D:
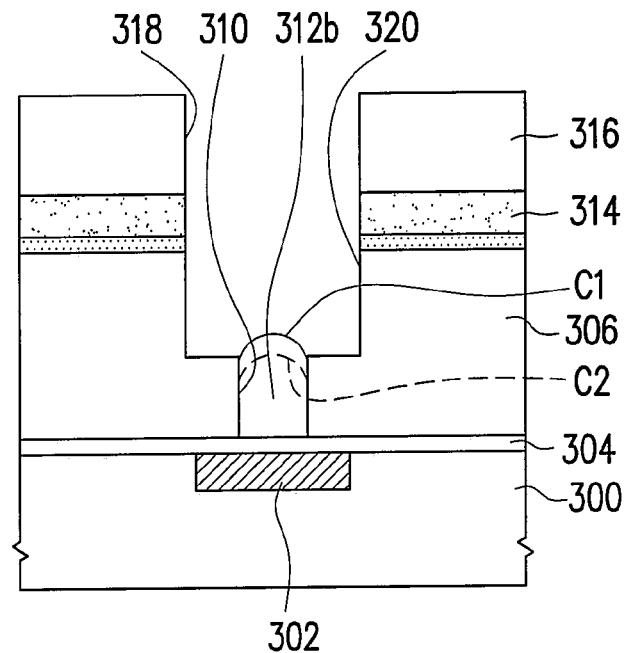

Then, referring to FIG. 3D, the photoresist layer 316 is used as a mask to etch the resistant layer 314, the cap layer 308, and the dielectric layer 306, so as to transfer the opening pattern 318 to the dielectric layer 306 and to form a trench 320 in the dielectric layer 306. The trench 320 is communicated with the via opening 310. In the etching process, the etching rate of the gap fill material 312a is larger than that of the resistant layer 314, and the etching rate of the gap fill material 312a is larger than that of the dielectric layer 306. Preferably, the etching rate of the gap fill material 312a is larger than that of the resistant layer 314, and the etching rate of the resistant layer 314 is larger than that of the dielectric layer 306. The etching selectivity of the gap fill material 312a to the resistant layer 314 ranges, for example, from 3 to 1.1, and the etching selectivity of the gap fill material 312a to the dielectric layer 306 ranges, for example, from 1.2 to 2. In an embodiment, in the etching process, an etching gas, for example, the gas free of oxygen, such as fluorohydrocarbon, which is capable of forming more polymers in the etching process is used as the etchant. The fluorohydrocarbon is selected from a group consisting of $CF_4$, $CF_3H$, $CH_2F_2$, $CFH_3$, and the mixture thereof. In an embodiment, at 250 millitorr, $CF_4$ of 155 sccm and $CF_3H$ of 95 sccm are used as the etching gas to perform the etching process. In another embodiment, in the etching process, the etching gas further includes carrier gas such as argon in addition to fluorohydrocarbon. In another embodiment, in the etching process, the etching gas further includes an adjusted gas such as nitrogen and carbon monoxide in addition to fluorohydrocarbon and the carrier gas. As the etching gas used in the etching process is the etching gas that can form more polymers, and the polymer formed in the etching process can protect the dielectric layer at the corner of the trench from being damaged by etching. Therefore, the problem of bridging caused by the rounding of the corner of the trench will not occur. In another aspect, as the etching rate of the gap fill material 312a is larger than that of the resistant layer 314 and the dielectric layer 306, in the etching process, the gap fill material 312a when exposed is quickly etched, so that the gap fill material 312b left after the etching process has a top surface with a convex shape. When the height of the gap fill material 312a is high, i.e. $h_1$, the remaining gap fill material 312b is C1. When the height of the gap fill material 312a is low, i.e. $h_2$, the remaining gap fill material 312b is C2 (indicated by the dotted line). No matter whether the gap fill material 312b is C1 or C2, the shadowing effect of the gap fill material will not occur, and the fence-shaped dielectric layer will not be left at the corner of the via opening 310.

Figure 3E:
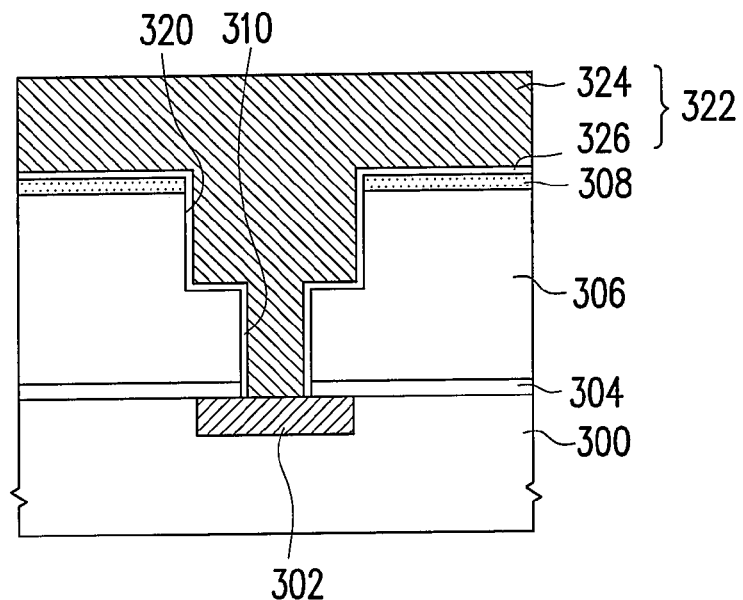

Then, referring to FIG. 3E, the photoresist layer 316, the resistant layer 314, and the gap fill material 312b are removed. In an embodiment, the photoresist layer 316, the resistant layer 314, and the gap fill material 312b can be removed at the same time through for example oxygen plasma ashing. Then, the liner 304 exposed by the via opening 310 is removed. Afterwards, a conductive layer 322 is formed on the substrate 300 and is filled in the trench 320 and the via opening 310. Usually, the conductive layer 322 includes a metal layer 324 and a barrier layer 326. The material of the barrier layer 326 is, for example, TiN or TaN. The metal layer 324 is, for example, a copper layer.

Figure 3F:
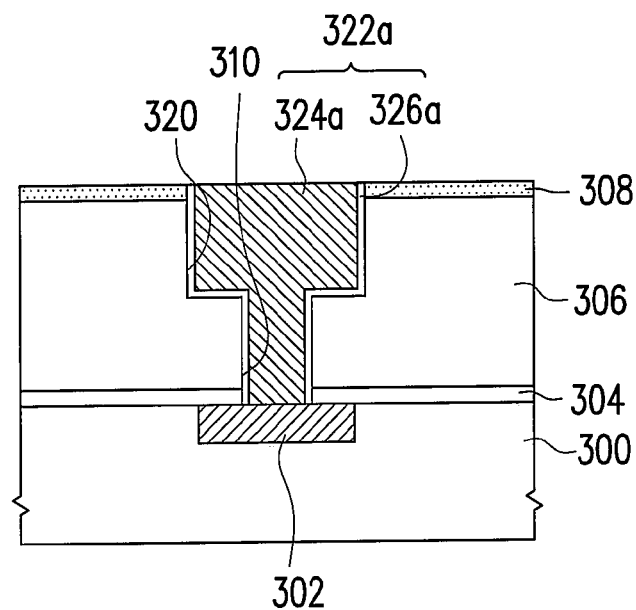

Then, referring to FIG. 3F, a part of the conductive layer 322 is removed, the conductive layer 322a in the trench 320 and the via opening 310 is left. The conductive layer 322a includes a metal layer 324a and a barrier layer 326a. The removing method can be chemical mechanical polishing. In the polishing process, the cap layer 308 is used as a polishing stop layer, so as to eliminate the problem of over-polishing the dielectric layer 306 due to the different polishing rates of the dense region and the loose region on the substrate 300.

The Second Embodiment

FIGS. 4A to 4D are schematic cross-sectional views of the processes of forming a composite opening according to an embodiment of the present invention.

Figure 4A:
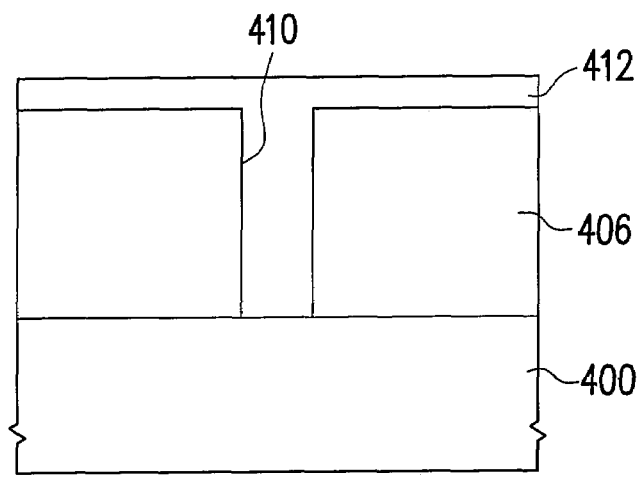
FIGS. 4A to 4D are schematic cross-sectional views of the processes of forming a composite opening according to an embodiment of the present invention.

Referring to FIG. 4A, a material layer 406 is formed on the substrate 400, the material thereof is not limited, and can be, for example, a dielectric layer such as a silicon oxide layer or any material that is predetermined to form the composite opening, and the forming method is, for example, CVD. Then, the photolithographic process and the etching process are performed to form a narrow opening 410 in the material layer 406. The etching gas used in the etching process is relative to the material of the dielectric layer. When the material layer 406 is silicon oxide, the etching gas is, for example, $CF_4/Ar/N_2$ or $CHF_3/Ar/N_2$. Then, a gap fill material 412 is filled in the narrow opening 410. The uniformity of the deposition of the gap fill material 412 is good, and the difference of the gap fill material 412 in the dense region and in the loose region is small. The material of the gap fill material 412 includes the polymer without anti-reflective property, for example, GF43 and DUV52, and the forming method is, for example, spin coating.

Figure 4B:
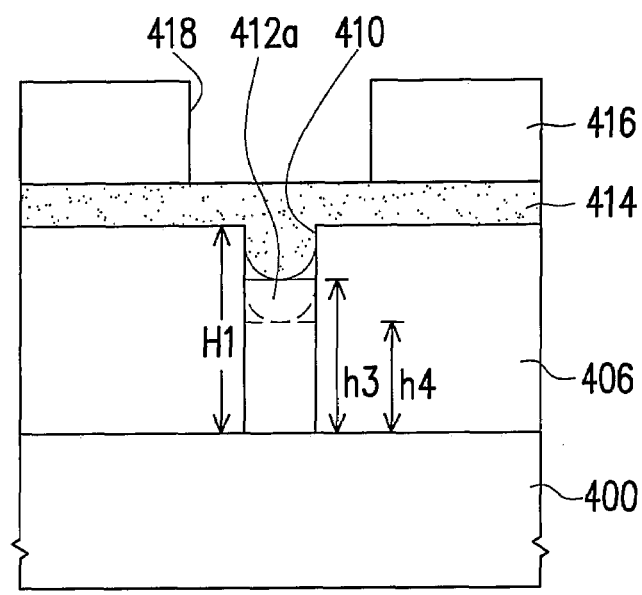

Then, referring to FIG. 4B, a part of the gap fill material 412 is removed, and the gap fill material 412a in the narrow opening 410 is left. The remaining gap fill material 412a has a substantial flat surface or a depressed surface with lower central portion and higher sides. The process of removing a part of the gap fill material 412 can be the etch back process. Then, a resistant layer 414 is formed on the substrate 400. The height of the remaining gap fill material 412a is not limited and can be $h_3$ or $h_4$ (indicated by the dotted line). The uniformity of the etch back of the gap fill material 412 is good, and difference between the remaining gap fill material 412a in the dense region and in the loose region is not obvious. Therefore, the resistant layer 414 formed subsequently has a fine uniformity and the surface is quite flat. In the subsequent photolithographic process, the quality of the patterning is not affected by the uneven height of the surface of the substrate. Afterwards, a patterned photoresist layer 416 is formed on the resistant layer 414. The photoresist layer 416 has an opening pattern 418, and the opening pattern 418 is a pattern that is predetermined to form the wide opening in the material layer 406.

Figure 4C:
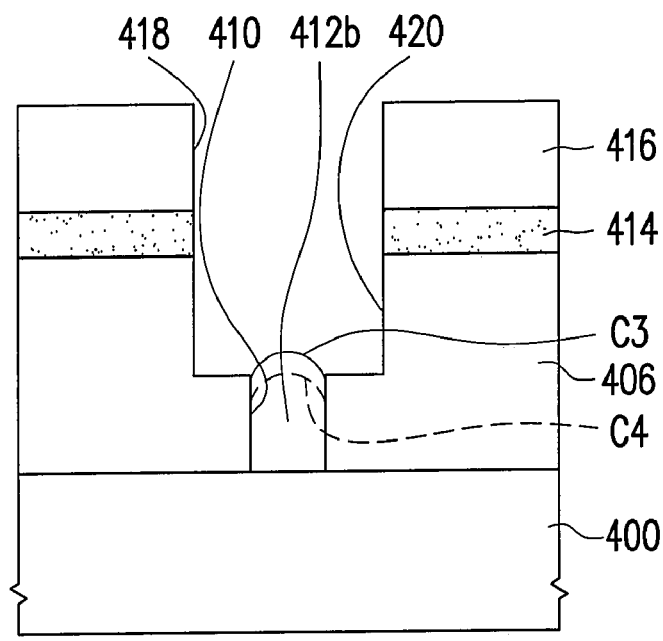

Then, referring to FIG. 4C, the photoresist layer 416 is used as a mask to etch the resistant layer 414, and the material layer 406, so as to transfer the opening pattern 418 to the material layer 406 and to form a wide opening 420 in the material layer 406. The wide opening 420 is communicated with the narrow opening 410. In the etching process, the etching rate of the gap fill material 412a is larger than that of the resistant layer 414, and the etching rate of the gap fill material 412a is larger than that of the material layer 406. Preferably, the etching rate of the gap fill material 412a is larger than that of the resistant layer 414, and the etching rate of the resistant layer 414 is larger than that of the material layer 406. The etching selectivity of the gap fill material 412a to the resistant layer 414 ranges, for example, from 3 to 1.1, and the etching selectivity of the gap fill material 412a to the material layer 406 ranges, for example, from 1.2 to 2. In an embodiment, the material layer 406 is silicon oxide. In the etching process, an etching gas, for example, the gas free of oxygen, such as fluorohydrocarbon, which is capable of forming more polymers in the etching process is used as the etchant. The fluorohydrocarbon is selected from a group consisting of $CF_4$, $CF_3H$, $CH_2F_2$, $CFH_3$, and the mixture thereof. In an embodiment, at 250 millitorr, $CF_4$ of 155 sccm and $CF_3H$ of 95 sccm are used as the etching gas to perform the etching process. In another embodiment, in the etching process, the etching gas further includes carrier gas such as argon in addition to fluorohydrocarbon. In another embodiment, in the etching process, the etching gas further includes an adjusted gas such as nitrogen and carbon monoxide in addition to fluorohydrocarbon and the carrier gas. As the etching gas used in the etching process is the etching gas that can form more polymers, and the polymer formed in the etching process can protect the dielectric layer at the corner of the wide opening from being damaged by etching. Therefore, the problem of rounding the corner of the wide opening will not occur. In another aspect, as the etching rate of the gap fill material 412a is larger than that of the resistant layer 414 and the material layer 406, in the etching process, the gap fill material 412a when exposed is quickly etched, so as to make the gap fill material 412b left after the etching process has a top surface with a convex shape. When the height of the gap fill material 412a is high, i.e. $h_3$, the remaining gap fill material 412b is C3. When the height of the gap fill material 412a is low, i.e. $h_4$, the remaining gap fill material 412b is C4 (indicated by the dotted line). No matter whether the gap fill material 412b is C3 or C4, the shadowing effect of the gap fill material will not occur, and the fence-shaped material layer is not left at the corner of the narrow opening 410.

Figure 4D:
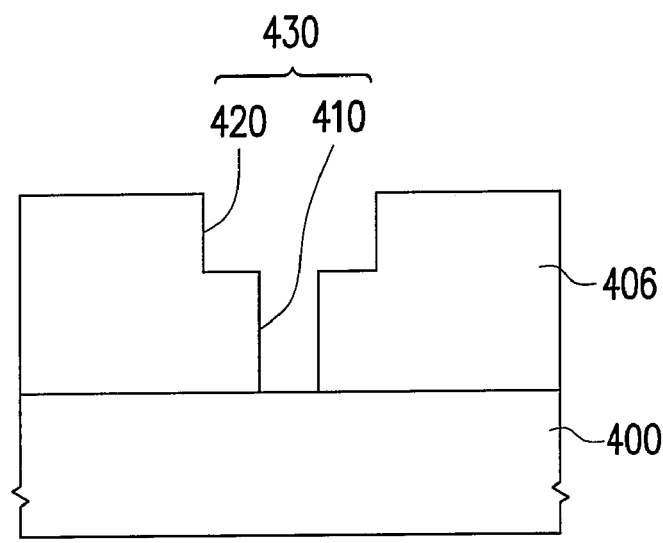

Then, referring to FIG. 4D, the photoresist layer 416, the resistant layer 414, and the gap fill material 412b are removed to expose the narrow opening 410, and the narrow opening 410 and the wide opening 420 constitute a composite opening 430. In an embodiment, the photoresist layer 416, the resistant layer 414, and the gap fill material 412b can be removed at the same time through for example oxygen plasma ashing.

The method of fabricating the composite opening can be used in any process requiring that the wide opening and the narrow opening are formed at the same time.

The method of forming a composite opening of the present invention includes using a gap fill material with the etching rate larger than that of the resistant layer in the narrow opening first formed, and the remaining of the gap fill material having a top surface with a convex shape. Therefore, the present invention can prevent the corner of the wide opening from being rounded and prevent the forming of fence at the corner of the narrow opening.

The method of fabricating the dual damascene structure of the present invention is of using a gap fill material with the etching rate larger that of the resistant layer in the via opening first formed, and the remaining of the gap fill material having a top surface with a convex shape. Therefore, the present invention can prevent the corner of the trench from being rounded, operate an etching process in an oxygen-free atmosphere to prevent the two neighboring dual damascene structures from being bridged, and prevent the forming of the fence-shaped dielectric layer at the corner of the via opening.

It will be apparent to those skilled in the art that various modifications and variations can be made to the structure of the present invention without departing from the scope or spirit of the invention. In view of the foregoing, it is intended that the present invention modifications and variations of this invention provided they fall within the scope of the following claims and their equivalents.

What is claimed is:

1. A dual damascene process, comprising:
   providing a substrate, having a conductive region covered by a liner;
   forming a dielectric layer on the liner;
   forming a via opening in the dielectric layer to align with the conductive region and to expose the liner;
   filling a gap fill material in the via opening;
   forming a resistant layer on the substrate to cover the dielectric layer and the gap fill material;
   performing a photolithographic process and an etching process to form a trench in the dielectric layer and to remain the gap fill material having a top surface with a convex shape, wherein in the etching process, the etching rate of the gap fill material is larger than that of the resistant layer
   removing the gap fill material, the resistant layer, and the liner exposed by the via opening; and
   forming a conductive layer in the trench and the via opening.

2. The dual damascene process as claimed in claim 1, wherein in the etching process, the etching selectivity of the gap fill material to the resistant layer ranges from 3 to 1.1.

3. The dual damascene process as claimed in claim 1, wherein in the etching process, the etching rate of the gap fill material is larger than that of the dielectric layer.

4. The dual damascene process as claimed in claim 3, wherein in the etching process, the etching selectivity of the gap fill material to the dielectric layer ranges from 1.2 to 2.

5. The dual damascene process as claimed in claim 1, wherein the etching rate of the resistant layer is larger than that of the dielectric layer.

6. The dual damascene process as claimed in claim 1, wherein in the etching process, an etching gas is free of oxygen.

7. The dual damascene process as claimed in claim 1, wherein an etching gas used in the etching process includes fluorohydrocarbon.

8. The dual damascene process as claimed in claim 7, wherein the etching gas further includes a carrier gas.

9. The dual damascene process as claimed in claim 8, wherein the etching gas further includes an adjusted gas.

10. The dual damascene process as claimed in claim 1, wherein the material of the dielectric layer comprises a low dielectric constant material.

11. The dual damascene process as claimed in claim 1, further comprising forming a cap layer on the dielectric layer before the via opening is formed.

12. The dual damascene process as claimed in claim 1, wherein the gap fill layer comprises a polymer without anti-reflective property.

13. A method of forming a composite opening, comprising:
   forming a material layer on a substrate;
   forming a narrow opening in the material layer;
   forming a gap fill material in the narrow opening;
   forming a resistant layer on the substrate to cover the material layer and the gap fill material;
   performing a photolithographic process and an etching process to form a wide opening in communication with the narrow opening in the material layer, and to remains the gap fill material having a top surface with a convex shape, wherein in the etching process, the etching rate of the gap fill material is larger than that of the resistant layer and removing the gap fill material and the resistant layer to expose the wide opening and the narrow opening, so as to form the composite opening.

14. The method of forming the composite opening as claimed in claim 13, wherein in the etching process, the etching selectivity of the gap fill material to the resistant layer ranges from 3 to 1.1.

15. The method of forming the composite opening as claimed in claim 13, wherein in the etching process, the etching rate of the gap fill material is larger than that of the material layer.

16. The method of forming the composite opening as claimed in claim 15, wherein in the etching process, the etching selectivity of the gap fill material to the material layer ranges from 1.2 to 2.

17. The method of forming the composite opening as claimed in claim 13, wherein the etching rate of the resistant layer is larger than that of the material layer.

18. The method of forming the composite opening as claimed in claim 13, wherein the material of the gap fill material comprises a polymer without anti-reflective property.

19. The method of forming the composite opening as claimed in claim 13, wherein an etching gas used in the etching process includes fluorohydrocarbon.

20. The method of forming the composite opening as claimed in claim 19, wherein the etching gas further includes a carrier gas.

21. The method of forming the composite opening as claimed in claim 20, wherein the etching gas further includes an adjusted gas.

* * * * *